US006535021B1

(12) United States Patent
Song

(10) Patent No.: US 6,535,021 B1
(45) Date of Patent: Mar. 18, 2003

(54) LOGIC GATE CIRCUIT WITH LOW SUB-THRESHOLD LEAKAGE CURRENT

(75) Inventor: Sang Hurn Song, Seoul (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/630,658

(22) Filed: Aug. 1, 2000

(30) Foreign Application Priority Data

Dec. 30, 1999 (KR) .............................................. 99-66243

(51) Int. Cl.[7] ........................ H03K 19/20; H03K 19/094
(52) U.S. Cl. ......................... 326/121; 326/88; 327/390
(58) Field of Search ............................. 326/121, 88, 27, 326/83; 327/390, 589

(56) References Cited

U.S. PATENT DOCUMENTS 5,729,165 A * 3/1998 Lou et al. .................... 327/112
6,242,973 B1 * 6/2001 Kong et al. .................. 327/589

FOREIGN PATENT DOCUMENTS

JP          04357710 A  * 12/1992  ............... 326/121

* cited by examiner

*Primary Examiner*—Daniel Chang
(74) *Attorney, Agent, or Firm*—Birch, Stewart, Kolasch & Birch, LLP

(57) ABSTRACT

The present invention relates to a logic gate circuit capable of reducing sub-threshold leakage current by applying the reverse voltage to the gate of a turned-off MOS device. The logic gate circuit in accordance with the present invention includes a CMOS logic gate having PMOS devices and NMOS devices with a low threshold voltage, a first voltage generator applying a first reverse voltage to the PMOS device of the CMOS logic gate during a pull-down operation, and a second voltage generator outputting a second reverse voltage to the NMOS device of the CMOS logic gate during a pull-up operation. The first voltage generator outputs a voltage greater than the source voltage by the threshold voltage to the first MOS device when the second MOS device performs a pull-down operation, and the second voltage generator outputs a voltage smaller than the earth voltage by the threshold voltage when the first MOS device performs a pull-up operation.

10 Claims, 3 Drawing Sheets

US 6,535,021 B1

LOGIC GATE CIRCUIT WITH LOW SUB-THRESHOLD LEAKAGE CURRENT

BACKGROUND OF THE INVENTION

1. Field of the Invention

The present invention relates to a semiconductor integrated circuit and, in particular, to a logic gate circuit with a low sub-threshold leakage current.

2. Description of the Background Art

As the source voltage of a semiconductor integrated circuit is being reduced for the purpose of improving the reliability of a device and lowering the power, the threshold voltage($V_T$) of a MOS device is also being reduced in order to maintain operation performance. However, when the threshold voltage($V_T$) of the MOS device is reduced, the off-leakage current flowing through a channel of turned-off MOS devices is increased, thereby causing serious power dissipation. Therefore, many studies for reducing sub-threshold current are currently being made intensively of a circuit.

FIG. 1 illustrates a conventional logic gate circuit capable of reducing sub-threshold leakage current.

As illustrated in FIG. 1, the conventional logic gate circuit includes a main power lines (Vcc) (Vss), local power lines each connected to the main power lines (Vcc) (Vss), and an inverter 10 and a CMOS logic gate 12 each connected between the local power lines (Vcc_L) (Vss_L).

MOS devices (M1) (M2) has a high threshold voltage (High $V_T$), and are controlled by signals (ACTb) (ACT) representing an operation state (active state) of a semiconductor memory, respectively. And, the inverter 10 including MOS devices (M3) (M4) with a low threshold voltage (Low $V_T$) reverses an input signal (IN). The CMOS logic gate 12 performs a logic function preset according to the output of the inverter 10, for example, an inverting operation. In addition, the CMOS logic gate can be implemented so that it performs other logic functions (NAND, NOR) using the output of the inverter 10 and an external control signal (not shown).

The operation of the conventional logic gate circuit thusly configured is as follows.

During an active operation, since the signals (ACT) (ACTb) are high and low levels, respectively, the MOS devices (M1) (M2) are turned on. As the result, the main power line (Vcc) and the local power line (Vcc_L) connected with each other through the MOS device (M1) maintains the same voltage, and the main power line (Vss) and the local power line (Vss_L) connected with each other through the MOS device (M2) also maintains the same voltage. Therefore, the inverter 10 and the CMOS logic gate 12 positioned between the main power lines and the local power lines can carry out a normal operation.

During a standby operation, the MOS devices (M1) (M2) are turned off by the low and high level signals (ACT) (ACTb). Due to this, the local power lines (Vcc_L) (Vss_L) are separated from the main power lines (Vcc) (Vss), and then the inverter 10 and the CMOS logic gate 12 are influenced by the local power lines (Vcc_L) (Vss_L). Therefore, the off-current of the CMOS logic gate 12, that is, a sub-threshold leakage current occurred by the turned-off MOS devices, is restricted.

However, the conventional logic gate circuit reduces the sub-threshold leakage current by providing itself with additional signals representing an active state and standby state, as well as existing signals.

And, the conventional logic gate circuit requires a number of power lines.

In addition, the conventional logic gate has a problem that MOS devices having at least two or more threshold voltages ($V_T$) has to be integrated in one chip.

SUMMARY OF THE INVENTION

Accordingly, it is an object of the present invention to provide a logic gate circuit for remarkably reducing sub-threshold leakage current using only existing signals.

It is another object of the present invention to provide a logic gate circuit for implementing various logic gates by combination of devices alone with a low threshold voltage.

In order to achieve the above objects, the logic gate circuit in accordance with the present invention includes a CMOS logic gate having PMOS devices and NMOS devices with a low threshold voltage, a first voltage generator applying a first reverse voltage to the PMOS device of the CMOS logic gate during a pull-down operation, and a second voltage generator outputting a second reverse voltage to the NMOS device of the CMOS logic gate during a pull-up operation.

The first voltage generator outputs a voltage greater than the source voltage by the threshold voltage to the first MOS device when the second MOS device performs a pull-down operation, and the second voltage generator outputs a voltage smaller than the earth voltage by the threshold voltage when the first MOS device performs a pull-up operation. And, the CMOS logic gate can be configured as a CMOS inverter, a NAND, or a NOR gate, and is replaceable according to the needs.

Additional advantages, objects and features of the invention will become more apparent from the description which follows.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

The preferred embodiments of the present invention will now be described with reference to the accompanying drawings.

Figure 1:
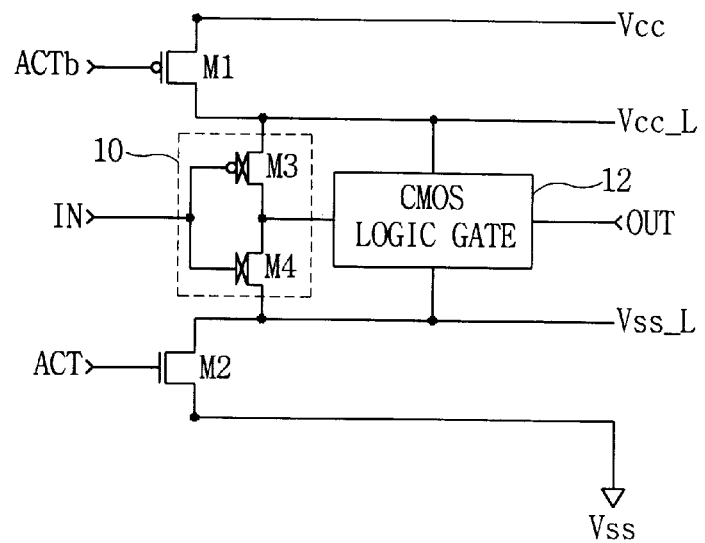
FIG. 1 is a block diagram of a logic gate circuit capable of reducing sub-threshold leakage current in the conventional art.
Figure 2:
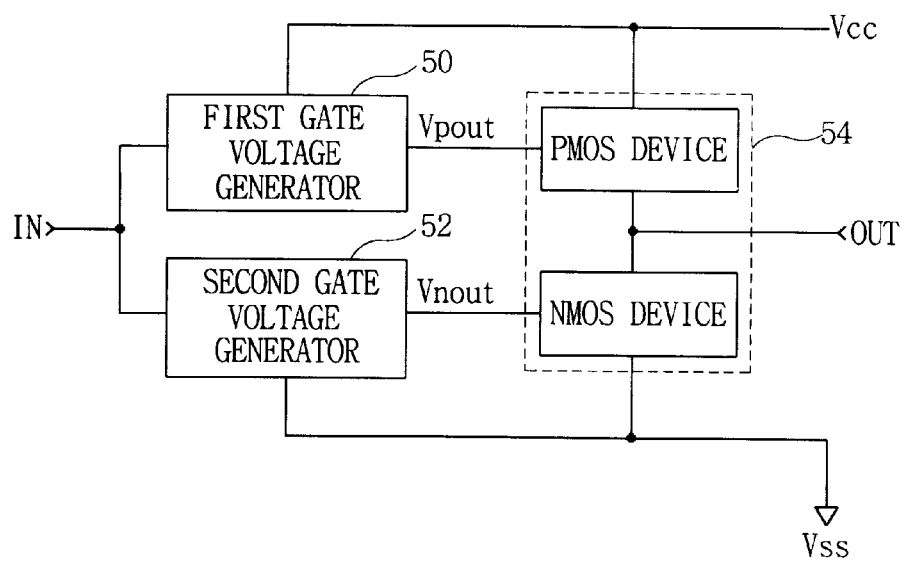
FIG. 2 is a block diagram of a logic gate circuit capable of reducing sub-threshold leakage current in accordance with the present invention.

The logic gate circuit in accordance with the present invention, as illustrated in FIG. 2, includes first and second voltage generators 50 and 52 and a CMOS logic gate 54.

The first and second voltage generators 50 and 52 are utilized to drive a PMOS device and NMOS device of the CMOS logic gate 54, respectively, during active and standby operations, and the first and second voltage generators 50 and 52 and the CMOS logic gate 54 are all implemented with MOS devices with a low threshold voltage (Low $V_T$).

The operation of the logic gate circuit in accordance with the present invention thusly configured will now be described with reference to the accompanying drawings.

The first and second voltage generators 50 and 52 output voltages (Vpout) (Vnout) for driving the PMOS device and NMOS device of the CMOS logic gate 54 according to an input signal (IN), respectively. At this time, when the voltages (Vpout) (Vnout) satisfy the conditions in Table 1, the reverse voltages are applied to the gate of a turned-off MOS device during active and standby operations, thereby reducing sub-threshold leakage current due to a reduction in threshold voltage ($V_T$).

TABLE 1

| IN | Vpout | Vnout |
|---|---|---|
| low level | Vpout < Vcc- |$V_{TP}$| | Vnout < Vss |
| high level | Vpout > Vcc | Vnout > |$V_{TN}$| -Vss |

Herein, VTP and VTN are threshold voltages of the PMOS device and NMOS device included in the CMOS logic gate 54, respectively.

Figure 3:
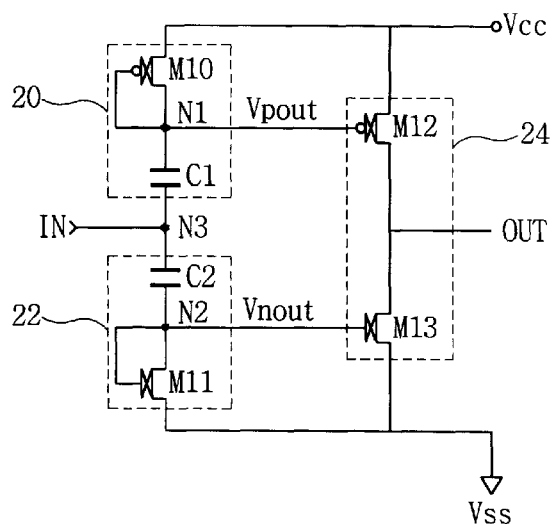
FIG. 3 is a block diagram of an inverter logic gate circuit in accordance with a first embodiment of the logic gate circuit illustrated in FIG. 2.

FIG. 3 is a block diagram of an inverter logic gate 100 in accordance with a first embodiment of the logic gate circuit of FIG. 2. In FIG. 3, a pull-up unit 20 including a PMOS device (M10) and a capacitor (C2) corresponds to the first voltage generator 50, and a pull-down unit 22 including a NMOS device (M11) and a capacitor (C2) corresponds to the second voltage generator 52. In addition, a CMOS inverter 24 including a PMOS device (M12) and a NMOS device (M13) corresponds to the CMOS logic gate 54.

In an initial state, nodes (N1) (N2) are charged to a source voltage (Vdd) level and an earth voltage (Vss) level, respectively. In this state, when an input signal (IN) is transited to a high level as shown in (A) of FIG. 4, a node (N3) is charged to a Vdd level. Thus, the voltage of dte node (N1) becomes much higher than the source voltage (Vdd) by capacitance coupling between the nodes (N3) (N1), and the voltage of the node (N2) becomes the Vdd level. As a result, the reverse voltage (Vgs0) is applied to the gate of the PMOS devices (M10) (M12) by the voltages of the nodes (N1) (N3), that is, the output voltages (Vpout) (Vnout) as shown in (B) and (C) of FIG. 4, a voltage higher than the threshold voltage is applied to the gate of the NMOS devices (M11) (M13) Con sequently, the PMOS devices (M10) (M12) are strongly turned off, and the NMOS devices (M11) (M13) are turned on, whereby the output of the CMOS inverter 23 is pulled down to the earth level as shown in (D) of FIG. 4.

Figure 4:
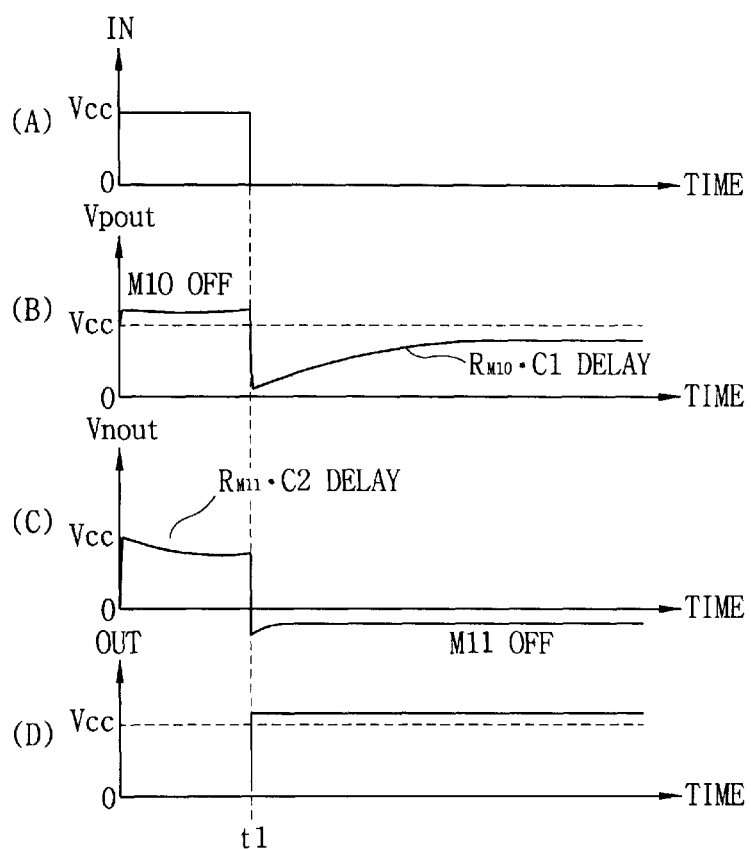
FIG. 4 is an input-output waveform view of each unit in FIG. 3.

When an input signal (IN) is transited from a high level to a low level, the voltages of the nodes (N1) (N2), that is, the output voltages (Vpout) (Vnout) of the first and second voltage generators 50 and 52 becomes as shown in (B) and (C) of FIG. 4 by capacitance coupling between the nodes (N3) (N1). Subsequently, the NMOS devices (M11) (M13) are strongly turned off, and the PMOS devices (M10) (M12) are turned on. As a result, the output of the CMOS inverter 24 is pulled up to the Vdd level as shown in (D) of FIG. 4.

In this way, in the present invention, the reverse voltage as much as the threshold voltage ($V_T$) is applied to the gate of the PMOS device (M12) during a pull-down operation, and the reverse voltage as much as $-V_T$ is applied to the gate of the NMOS device (M13), thereby reducing sub-threshold leakage current occurred by the off MOS device (M12 or M13).

Figure 5:
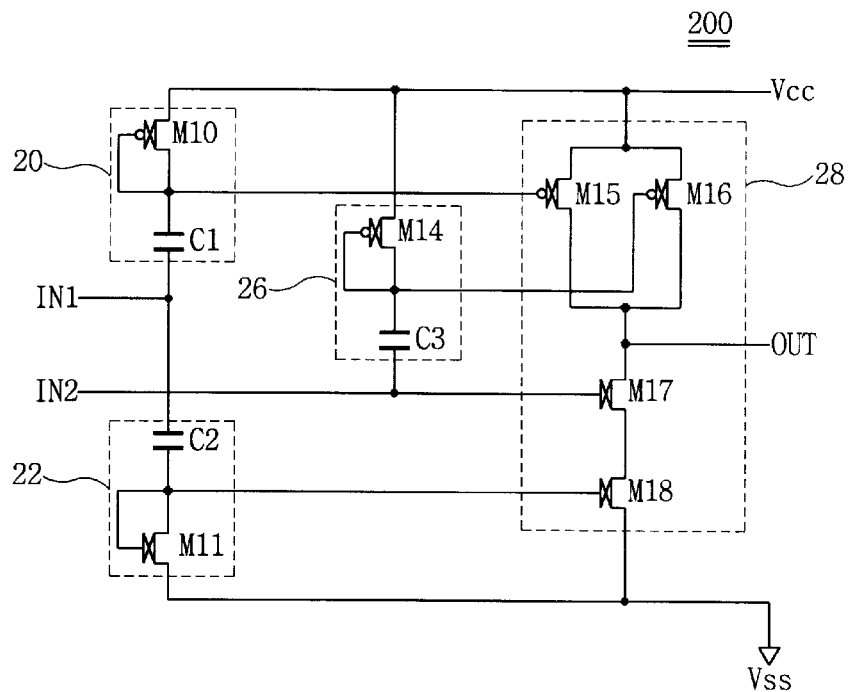
FIG. 5 is a block diagram of a NAND logic gate circuit in accordance with a second embodiment of the logic gate illustrated in FIG. 2.

FIG. 5 is a block diagram of a NAND logic gate 200 in accordance with a second embodiment of the logic gate circuit of FIG. 2. As illustrated in FIG. 5, in the NAND logic gate 200, the CMOS logic gate 54 is configured as a NAND gate 28 having PMOS devices (M15) (M16) and NMOS devices (M17) (M18), and a pull-up unit 26 operating as a voltage generator in order to drive the PMOS device (M16) of the NAND gate 28 is additionally included. At this time, the pull-up unit 26 is connected between the source voltage (Vdd) and a second input signal (IN2) terminal, has the same configuration as the pull-up unit 20.

Figure 6:
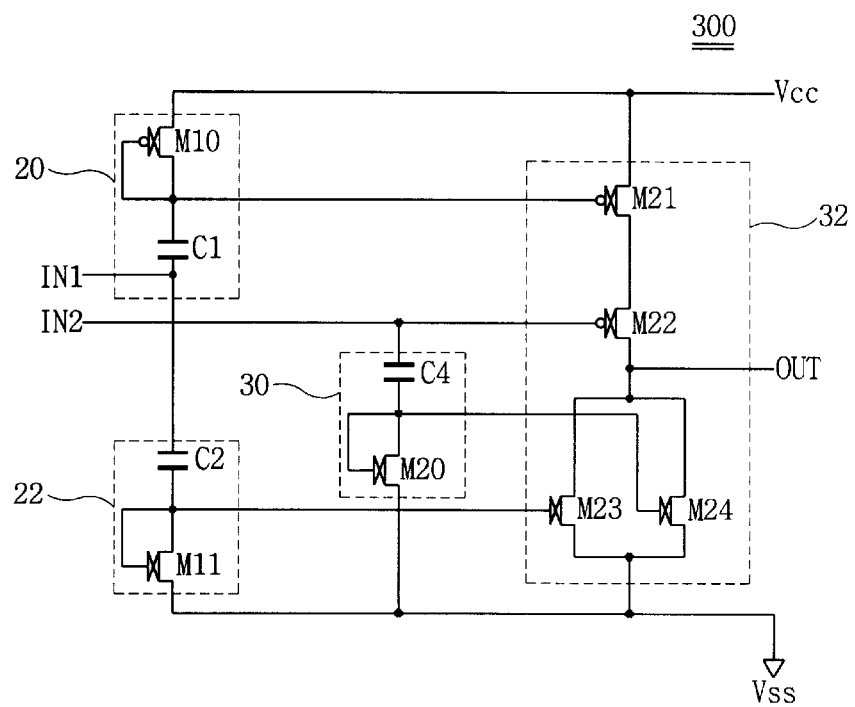
FIG. 6 is a block diagram of a NOR logic gate circuit in accordance with a third embodiment of the logic gate illustrated in FIG. 2.

FIG. 6 is a block diagram of a NOR logic gate 300 in accordance with a third embodiment of the present invention of the logic gate circuit of FIG. 2. As illustrated in FIG. 6, in the NOR logic gate 300, the CMOS logic gate 54 is configured as a NOR gate 32 having PMOS devices (M21) (M22) and NMOS devices (M23) (M24), and a pull-down unit 30 operating as voltage generator in order to drive the NMOS device (M24) of the NOR gate 32 is additionally included. At this time, the pull-down unit 30 is connected between the second input signal (IN2) terminal and the earth, and has the same configuration as the pull-down unit 22.

Moreover, the operations of the NAND and NOR logic gates 200 and 300 are achieved in the same manner as the above-described inverter logic gate 100, and thus a detailed description thereof will be omitted.

The present invention is not limited to the configuration of the CMOS logic gate as an inverter, a NAND gate, or a NOR gate, and a logic gate with a low sub-threshold leakage current can be implemented by replacing the logic gate cell of the CMOS logic gate.

Accordingly, it will be appreciated that the embodiments of the present invention which have been discussed herein are merely illustrative of a few applications of the principles of the invention. Numerous modifications may be made by those skilled in the art without departing from the true spirit and scope of the invention.

As described above, the logic gate circuit in accordance with the present invention has an effect of remarkably reducing sub-threshold leakage current by applying the reverse voltage to the gate of a turned-off MOS device in normal operation.

In addition, the present invention has an effect of easily implementing a logic gate circuit by combination of MOS devices with a low threshold voltage.

In addition, the present invention has an effect of implementing various logic gate circuits using existing signals by replacing only the gate cell of a CMOS logic gate.

What is claimed is:

1. A logic gate circuit, comprising:
   a first voltage generator outputting a drive voltage to a first MOS device; and
   a second voltage generator outputting a drive voltage to a second MOS device, wherein the first voltage generator applies a voltage greater than the source voltage by the threshold voltage to the first MOS device when the second MOS device performs a pull-down operation, and the second voltage generator applies a voltage smaller than the earth voltage by the threshold voltage when the first MOS device performs a pull-up operation.

2. The circuit of claim 1, wherein the first MOS device is a p-type, and the second MOS device is a n-type.

3. The circuit of claim 1, wherein the first and second MOS devices forms an inverter, a NAND gate, or a NOR gate.

4. The circuit of claim 3, wherein, when the first and second MOS devices forms a NAND gate, another input signal and a voltage generator identical to the first voltage generator operating according to the input signal are additionally included.

5. The circuit of claim 3, wherein, when the first and second MOS devices forms a NOR gate, another input signal and a voltage generator identical to the second voltage generator operating according to the input signal are additionally included.

6. A logic gate circuit, comprising:

a first voltage generator outputting a drive voltage to a first MOS device;

a second voltage generator, outputting a drive voltage to a second MOS device, wherein, the MOS device of the first voltage generator is of p-type and is connected between a source voltage terminal and a first output terminal, with its gate and drain commonly connected to the first output terminal; and a capacitor of the first voltage generator is connected to the first output terminal and an input terminal; and the MOS device of the second voltage generator is of n-type and is connected between a second output terminal and the earth, with its gate and drain commonly connected to the second output terminal; and a capacitor of the first voltage generator is connected between the input terminal and the second output terminal.

7. The circuit of claim 6, wherein the NMOS device and the PMOS device has a low threshold voltage.

8. A logic gate circuit, comprising:

a CMOS logic gate having MOS devices with a low threshold voltage;

a first voltage generator applying a first reverse voltage to the gate of a PMOS device of the CMOS logic gate in a pull-down operation; and a second voltage generator outputting a second reverse voltage to the gate of a NMOS device of the CMOS logic gate in a pull-up operation, wherein the first reverse voltage is greater than the source voltage by the threshold voltage, and the second reverse voltage is smaller than the earth level by the threshold voltage.

9. The circuit of claim 8, wherein the CMOS logic gate is configured as aninverter, a NAND gate.

10. A logic gate circuit comprising:

a CMOS logic gate have MOS devices with a low threshold voltage;

a first voltage generator applying a first reverse voltage to the gate of a PMOS device of the CMOS logic gate in a pull-down operation, wherein a MOS device of the first voltage generator is of p-type and is connected between a source voltage terminal and a first output terminal, with its gate and drain commonly connected to the first output terminal; and a capacitor of the first voltage generator is connected to the first output terminal and an input terminal; and a second voltage generator outputting a second reverse voltage to the gate of a NMOS device of the CMOS logic gate in a pull-up operation, wherein a MOS device of the second voltage generator is of n-type and is connected between a second output terminal and the earth, with its gate and drain commonly connected to the second output terminal; and a capacitor of the second voltage generator is connected between the input terminal and the second output terminal.

\* \* \* \* \*